(12) United States Patent
Lin et al.

(10) Patent No.: US 9,607,974 B2
(45) Date of Patent: Mar. 28, 2017

(54) PACKAGE STRUCTURE AND FABRICATION METHOD THEREOF

(71) Applicant: Siliconware Precision Industries Co., Ltd., Taichung (TW)

(72) Inventors: Chun-Tang Lin, Taichung (TW); Shih-Ching Chen, Taichung (TW); Yi-Che Lai, Taichung (TW); Hong-Da Chang, Taichung (TW); Hung-Wen Liu, Taichung (TW); Yi-Wei Liu, Taichung (TW); Hsi-Chang Hsu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/940,554

(22) Filed: Nov. 13, 2015

(65) Prior Publication Data

US 2016/0141227 A1    May 19, 2016

(30) Foreign Application Priority Data

Nov. 17, 2014  (TW) .............................. 103139710 A

(51) Int. Cl.
*H01L 25/00*  (2006.01)
*H01L 25/065*  (2006.01)
(Continued)

(52) U.S. Cl.
CPC .......... *H01L 25/50* (2013.01); *H01L 21/6835* (2013.01); *H01L 23/3128* (2013.01); *H01L 24/19* (2013.01); *H01L 24/20* (2013.01); *H01L 24/96* (2013.01); *H01L 25/0657* (2013.01); *H01L 21/568* (2013.01); *H01L 24/16* (2013.01); *H01L 24/48* (2013.01); *H01L 2221/68359* (2013.01); *H01L 2221/68372* (2013.01); *H01L 2224/04042* (2013.01); *H01L 2224/04105* (2013.01); *H01L 2224/12105* (2013.01); *H01L 2224/16227* (2013.01); *H01L 2224/48091* (2013.01); *H01L 2224/48227* (2013.01); *H01L 2225/06548* (2013.01); *H01L 2225/1035* (2013.01); *H01L 2225/1041* (2013.01);
(Continued)

(58) Field of Classification Search
CPC ....................................................... H01L 23/48
See application file for complete search history.

(56) References Cited

U.S. PATENT DOCUMENTS

2004/0145044 A1*  7/2004  Sugaya ................... H01L 21/56
                                                                        257/698
2012/0020040 A1*  1/2012  Lin ...................... H01L 25/0652
                                                                        361/772
(Continued)

*Primary Examiner* — William Harriston
(74) *Attorney, Agent, or Firm* — Mintz Levin Cohn Ferris Glovsky and Popeo, P.C.; Peter F. Corless; Steven M. Jensen

(57) ABSTRACT

A method for fabricating a package structure is provided, which includes: providing a first carrier having a circuit layer thereon; forming a plurality of conductive posts on the circuit layer and disposing at least an electronic element on the first carrier; forming an encapsulant on the first carrier to encapsulate the conductive posts, the circuit layer and the electronic element; and removing the first carrier, thereby dispensing with the conventional hole opening process for forming the conductive posts and hence reducing the fabrication costs.

6 Claims, 7 Drawing Sheets

(51) Int. Cl.
*H01L 21/683* (2006.01)
*H01L 23/31* (2006.01)
H01L 21/56 (2006.01)
H01L 23/00 (2006.01)

(52) U.S. Cl.
CPC .............. *H01L 2225/1058* (2013.01); *H01L 2924/15311* (2013.01); *H01L 2924/181* (2013.01); *H01L 2924/18162* (2013.01)

(56) References Cited

U.S. PATENT DOCUMENTS

2012/0091597 A1\* 4/2012 Kwon ................. H01L 23/48
257/777
2013/0200528 A1\* 8/2013 Lin ................. H01L 21/6836
257/774

\* cited by examiner

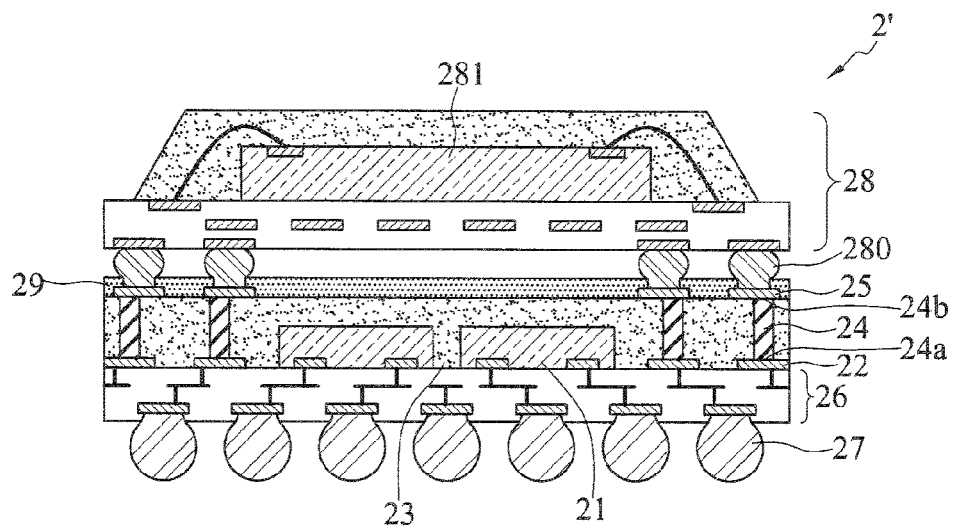
FIG.2H
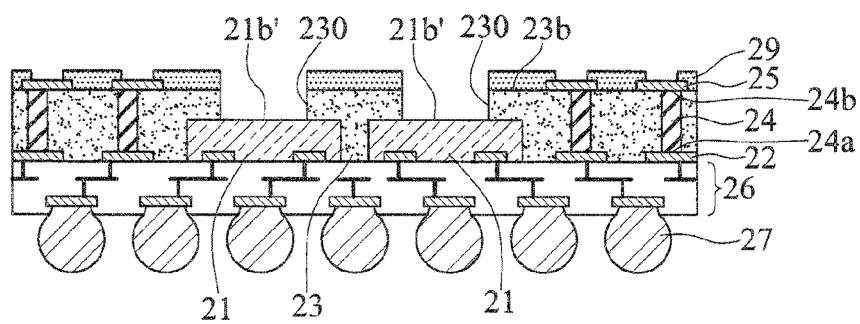
FIG.2H'
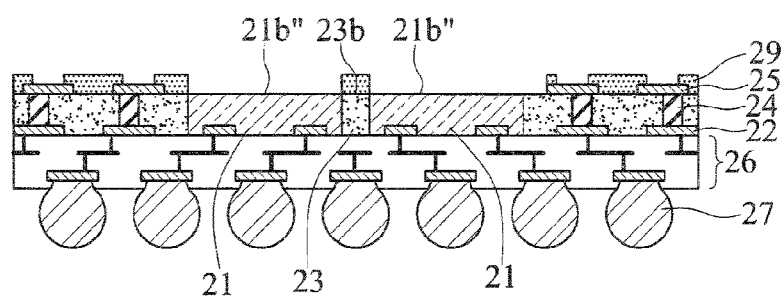
FIG.2H"

US 9,607,974 B2

PACKAGE STRUCTURE AND FABRICATION METHOD THEREOF

CROSS-REFERENCES TO RELATED APPLICATION

The application claims under 35 U.S.C. §119(a) the benefit of Taiwanese Application No. 103139710, filed Nov. 17, 2014 the entire contents for which are incorporated herein by reference.

BACKGROUND OF THE INVENTION

1. Field of the Invention

The present disclosure relates to a packaging process, and more particularly, to a package structure having an electronic element embedded therein and a method for fabricating the package structure.

2. Description of Related Art

Along with the development of semiconductor technologies, various types of packages have been developed for semiconductor products. Particularly, chip scale packages have been developed to meet the miniaturization requirement. A chip scale package is characterized in that its size is substantially equal to or slightly larger than a chip.

FIGS. 1A to 1H are schematic cross-sectional views showing a method for fabricating a semiconductor package 1 according to existing prior art.

Referring to FIG. 1A, a first carrier 10a having a bonding layer 100 is provided, and a plurality of semiconductor elements 11 are disposed on the bonding layer 100. Each of the semiconductor elements 11 has an active surface 11a bonded to the bonding layer 100 and an inactive surface 11b opposite to the active surface 11a. The active surface 11a of the semiconductor element 11 has a plurality of electrode pads 110.

Referring to FIG. 1B, an encapsulant 13 is formed on the bonding layer 100 to encapsulate the semiconductor elements 11. The encapsulant 13 has a first surface 13a facing the bonding layer 100 and a second surface 13b opposite to the first surface 13a. Further, a second carrier 10b is disposed on the second surface 13b of the encapsulant 13.

Referring to FIG. 1C, the first carrier 10a and the bonding layer 100 are removed to expose the first surface 13a of the encapsulant 13 and the active surfaces 11a of the semiconductor elements 11.

Referring to FIG. 1D, a circuit structure 12 is formed on the first surface 13a of the encapsulant 13 and the active surfaces 11a of the semiconductor elements 11, and electrically connected to the electrode pads 110 of the semiconductor elements 11.

Referring to FIG. 1E, a third carrier 10c is disposed on the circuit structure 12, and then the second carrier 10b is removed. Thereafter, a laser drilling process is performed to form a plurality of through holes 140 penetrating the encapsulant 13 and exposing a portion of the circuit structure 12.

Referring to FIG. 1F, an electroplating process is performed to form in the through holes 140 a plurality of conductive posts 14 electrically connected to the circuit structure 12 exposed from the encapsulant 13.

Referring to FIG. 1G, a redistribution layer 15 is formed on the second surface 13b of the encapsulant 13 and electrically connected to the conductive posts 14.

Referring to FIG. 1H, the third carrier 10c is removed and a singulation process is performed. Further, a plurality of conductive elements 17 such as solder balls are formed on and electrically connected to the circuit structure 12.

In the above-described method, the laser drilling process for forming the through holes 140 is time-consuming, especially when the number of the through holes 140 is large. Further, during the laser drilling process, residues easily accumulate on the bottom of the through holes 140. Accordingly, a cleaning process is required before the electroplating process is performed to form the conductive posts 14 in the through holes 140, thus increasing the number of fabrication steps and complicating the fabrication processes.

Furthermore, the laser drilling process results in uneven wall surfaces of the through holes 140. As such, during subsequent electroplating processes, a conductive material cannot be effectively attached to the wall surfaces of the through holes 140 and easily delaminates from the wall surfaces of the through holes 140, thereby reducing the product reliability of the semiconductor package 1.

In addition, since the laser drilling process is performed on the second surface 13b of the encapsulant 13 that is not transparent, a laser drilling device cannot detect the circuit structure 12 under the encapsulant 13. Therefore, special processes and devices are required for drilling alignment. As such, the number of fabrication steps and the fabrication costs are further increased.

Also, a laser beam used in the laser drilling process produces a heat affected zone. That is, if the position of the through holes 140 is close to the semiconductor elements 11, high heat resulted from the laser beam will damage the semiconductor elements 11. Therefore, a certain distance must be kept between the conductive posts 14 and the semiconductor elements 11, thus hindering miniaturization of the semiconductor package 1.

In addition, the above-described method includes multiple carrier bonding/removing processes (including, for example, the first, second and third carriers 10a, 10b, 10c). Theses processes complicate the fabrication process and increase the fabrication time and costs.

Therefore, there is a need to provide a package structure and a fabrication method thereof so as to overcome the above-described drawbacks.

SUMMARY OF THE INVENTION

In view of the above-described drawbacks, the present disclosure provides a package structure, which comprises: an encapsulant having opposite first and second surfaces; a circuit layer embedded in the first surface of the encapsulant; at least an electronic element embedded in the encapsulant; and a plurality of conductive posts formed on the circuit layer and embedded in the encapsulant, wherein each of the conductive posts has a first end bonded to the circuit layer and a second end opposite to the first end.

The present disclosure further provides a method for fabricating a package structure, which comprises: providing a first carrier having a circuit layer thereon; forming a plurality of conductive posts on the circuit layer and disposing at least an electronic element on the first carrier, wherein each of the conductive posts has a first end bonded to the circuit layer and a second end opposite to the first end; forming an encapsulant on the first carrier to encapsulate the conductive posts, the circuit layer and the electronic element, wherein the encapsulant has a first surface bonded to the first carrier and a second surface opposite to the first surface; and removing the first carrier.

In the above-described structure and method, a surface of the circuit layer can be flush with the first surface of the encapsulant.

In the above-described structure and method, a surface of the electronic element can be flush with the first surface of the encapsulant.

In the above-described structure and method, the electronic element can be exposed from the second surface of the encapsulant.

After removing the first carrier, the above-described method can further comprise forming on the first surface of the encapsulant a circuit structure electrically connected to the electronic element and the circuit layer. The above-described method can further comprise disposing a second carrier on the second surface of the encapsulant before removing the first carrier, and removing the second carrier after forming the circuit structure.

In the above-described structure and method, at least a redistribution layer can be formed on the second surface of the encapsulant and electrically connected to the second ends of the conductive posts.

In the above-described structure and method, at least an electronic device can be stacked on the second surface of the encapsulant and electrically connected to the second ends of the conductive posts.

According to the present disclosure, the circuit layer and the conductive posts are formed first, and then the encapsulant is formed to encapsulate the conductive posts and the circuit layer. As such, the present disclosure dispenses with conventional processes such as a laser drilling process for forming through holes, a cleaning process for cleaning the through holes, and an electroplating process for forming conductive posts in the through holes. Therefore, the present disclosure not only reduces the fabrication time, but also avoids delamination of the conductive posts caused by uneven wall surfaces of the through holes in existing prior art so as to increase product reliability.

Further, the present disclosure does not need any drilling alignment process and hence dispenses with the special processes and devices used in the prior art, thereby simplifying the fabrication process and reducing the fabrication costs.

Furthermore, since no laser drilling process is performed, no heat affected zone is produced in the present disclosure. Therefore, the position of the conductive posts can be designed according to practical needs, and the distance between the conductive posts and the electronic element can be reduced so as to meet the miniaturization requirement.

In addition, by dispensing with the hole opening process, the present disclosure only needs two carrier bonding/removing processes (including the first carrier and the second carrier), thereby simplifying the fabrication process and reducing the fabrication costs.

BRIEF DESCRIPTION OF DRAWINGS

FIGS. 2A to 2H" are schematic cross-sectional views showing a method for fabricating a package structure according to the present disclosure, wherein FIGS. 2G', 2H' and 2H" show other embodiments of FIG. 2G.

DETAILED DESCRIPTION OF PREFERRED EMBODIMENTS

The following illustrative embodiments are provided to illustrate the disclosure of the present disclosure. These and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "on," "a," etc. are merely for illustrative purposes and should not be construed to limit the scope of the present disclosure.

FIGS. 2A to 2H are schematic cross-sectional views showing a method for fabricating a package structure 2 according to the present disclosure.

Figure 1A:
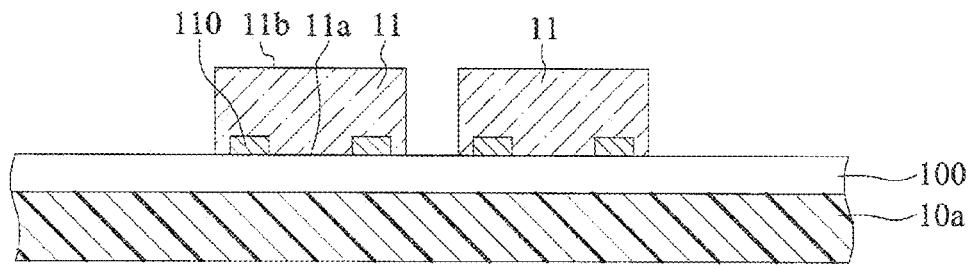
FIGS. 1A to 1H are schematic cross-sectional views showing a method for fabricating a semiconductor package according to existing prior art.
Figure 1B:
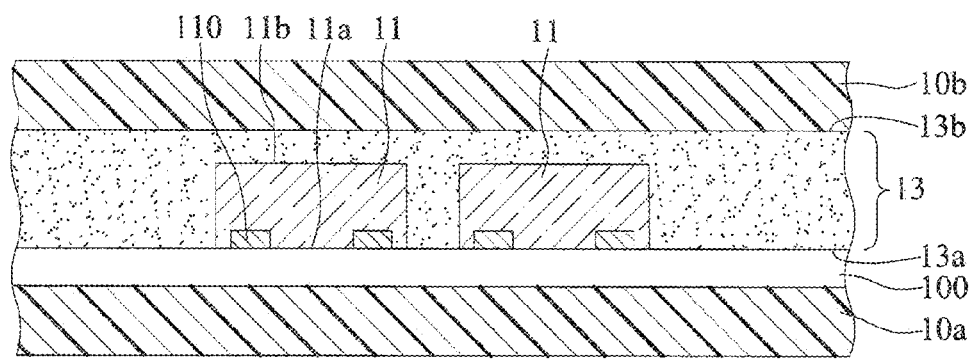
Figure 1C:
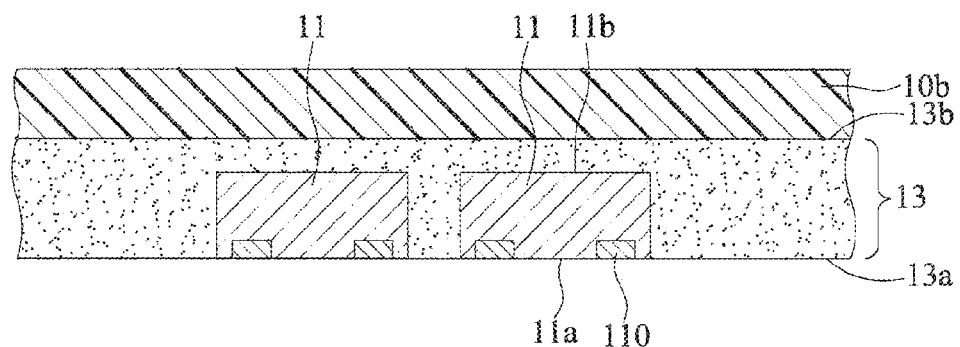
Figure 1D:
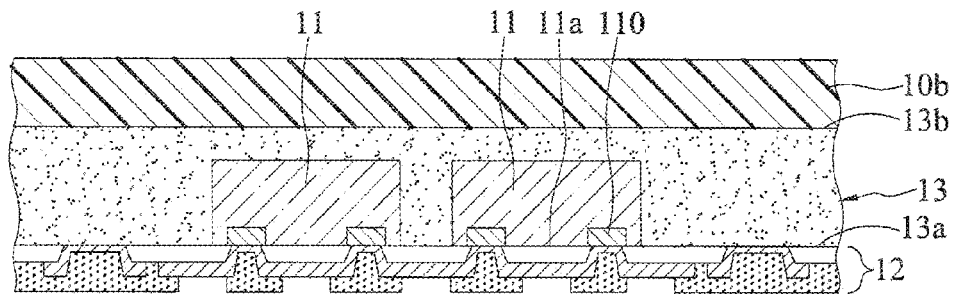
Figure 1E:
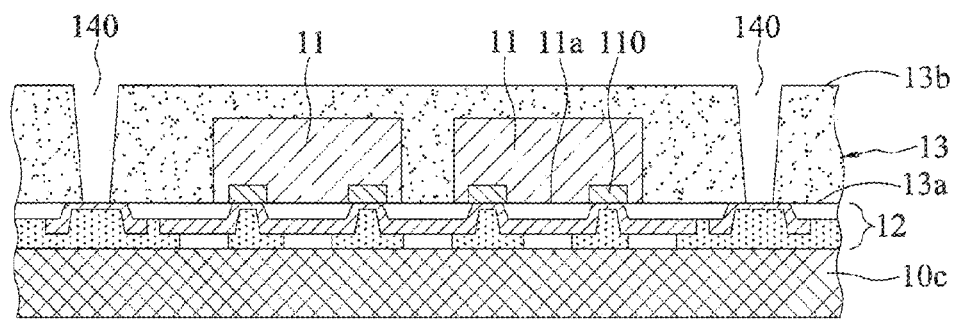
Figure 1F:
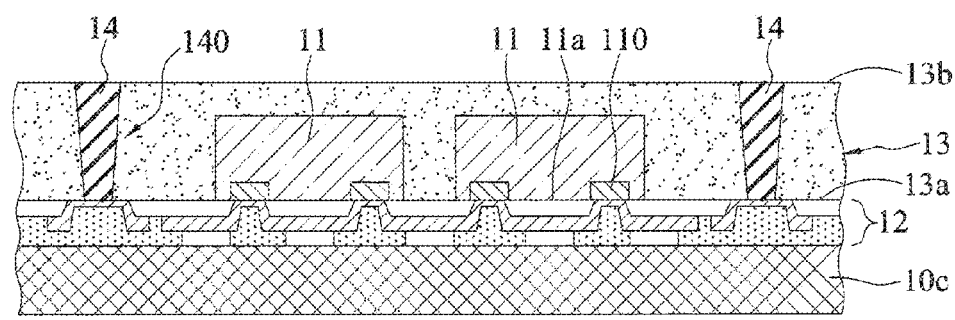
Figure 1G:
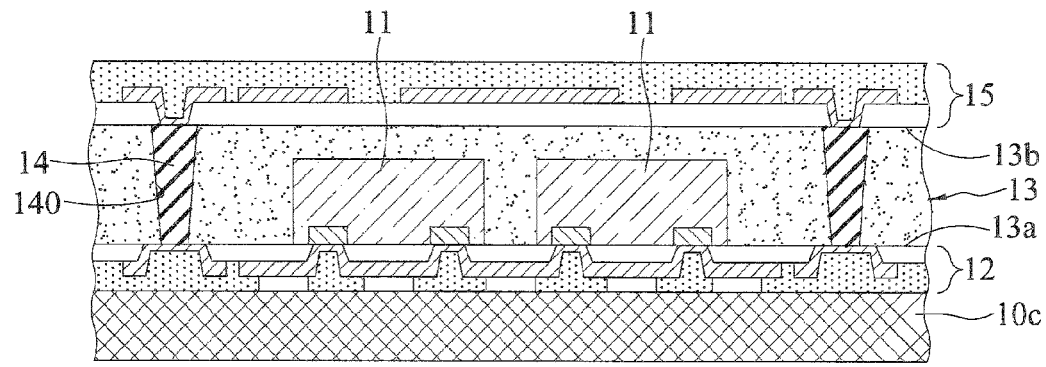
Figure 1H:
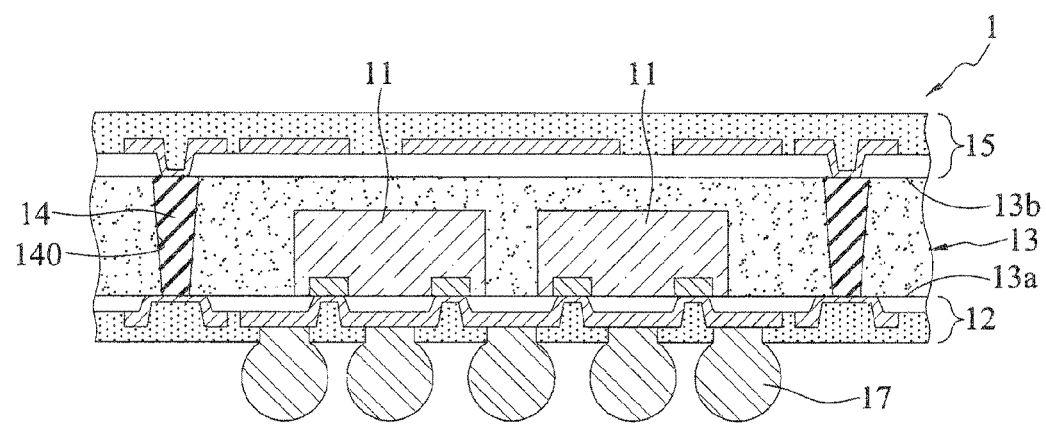
Figure 2A:
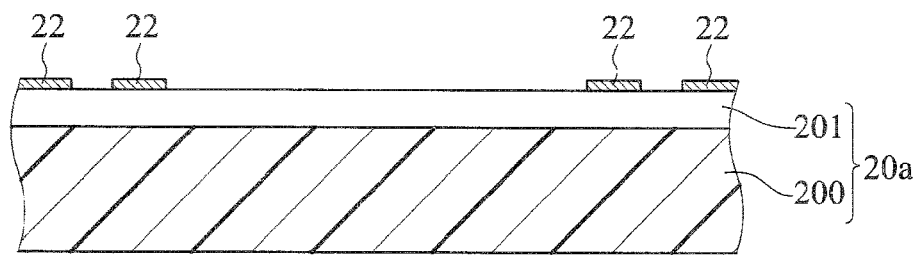

Referring to FIG. 2A, a first carrier 20a having a circuit layer 22 thereon is provided.

In the present embodiment, the first carrier 20a has a body 200 made of such as a semiconductor, dielectric, ceramic or metal material. The first carrier 20a can be a wafer-level or panel-level substrate according to practical needs.

The first carrier 20a further has a bonding layer 201 made of such as a release film or an adhesive material. The bonding layer 201 is formed on the body 200 of the first carrier 20a by coating or laminating.

Further, the circuit layer 22 has a plurality of conductive pads and a plurality of conductive traces.

Figure 2B:
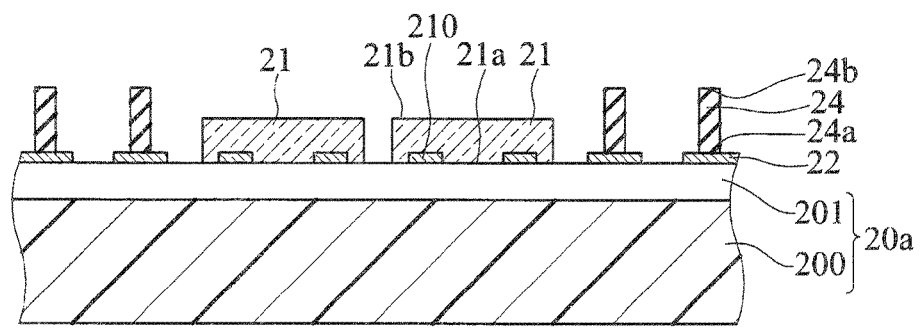

Referring to FIG. 2B, a plurality of conductive posts 24 are formed on the conductive pads of the circuit layer 22. Each of the conductive posts 24 has a first end 24a bonded to the circuit layer 22 and a second end 24b opposite to the first end 24a. Thereafter, a plurality of electronic elements 21 are disposed on the bonding layer 201 of the first carrier 20a.

In the present embodiment, the electronic elements 21 are arranged on a same plane and adjacent to one another. The electronic elements 21 are active elements such as semiconductor chips or passive elements such as capacitors. Each of the electronic elements 21 has an active surface 21a with a plurality of conductive pads 210 and an inactive surface 21b opposite to the active surface 21a. The electronic element 21 is bonded to the bonding layer 201 via the active surface 21a thereof.

Figure 2C:
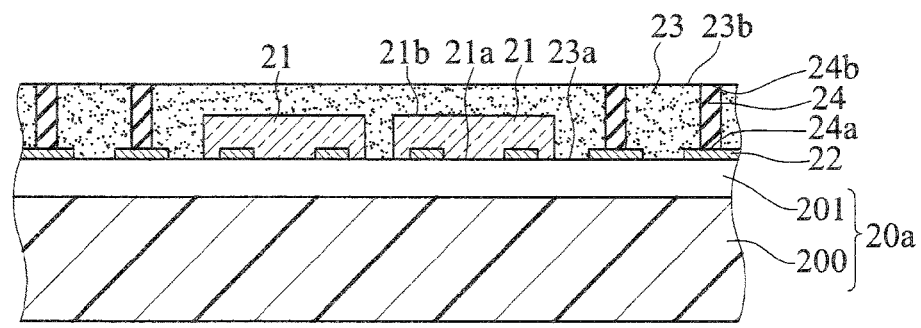

Referring to FIG. 2C, an encapsulant 23 is formed on the bonding layer 201 of the first carrier 20a to encapsulate the conductive posts 24, the circuit layer 22 and the electronic elements 21. The encapsulant 23 has a first surface 23a bonded to the bonding layer 201 and a second surface 23b opposite to the first surface 23a. The second ends 24b of the conductive posts 24 are exposed from the second surface 23b of the encapsulant 23.

The encapsulant 23 can be made of a liquid compound and formed by injection, lamination or molding.

Further, the inactive surfaces 21b of the electronic elements 21 are covered by the encapsulant 23.

Figure 2D:
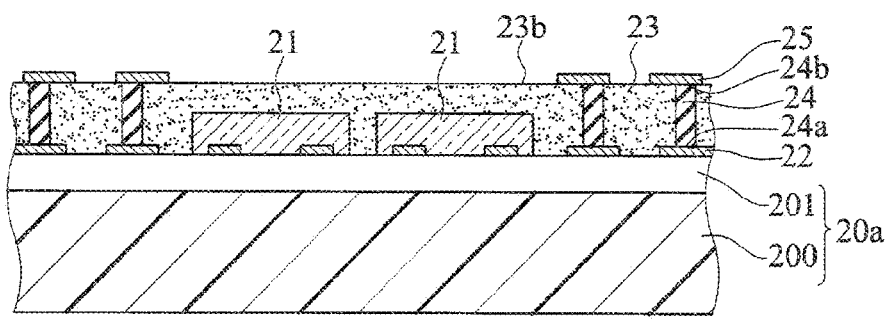

Referring to FIG. 2D, a redistribution layer 25 is formed on the second surface 23b of the encapsulant 23 and electrically connected to the second ends 24b of the conductive posts 24. As such, the redistribution layer 25 is electrically connected to the circuit layer 22 through the conductive posts 24.

In the present embodiment, the redistribution layer 25 is a single layer. In another embodiment, as shown in FIG. 2G', a plurality of redistribution layers 25' are formed on the second surface 23b of the encapsulant 23.

Figure 2E:
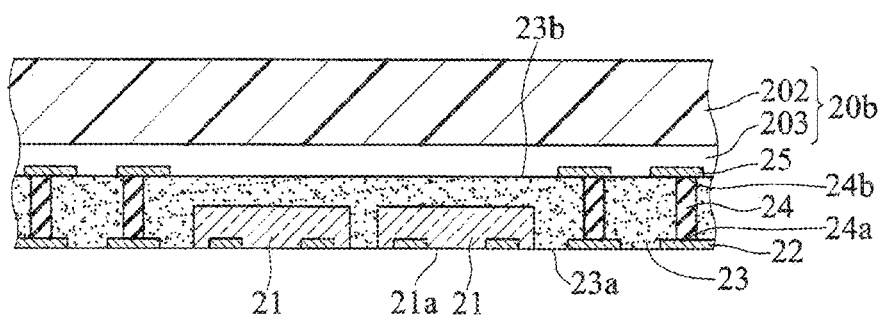

Referring to FIG. 2E, a second carrier 20b is disposed on the second surface 23b of the encapsulant 23 and the redistribution layer 25. Then, the first carrier 20a is removed to expose the circuit layer 22, the first surface 23a of the encapsulant 23 and the active surfaces 21a of the electronic elements 21.

In the present embodiment, the second carrier 20b has a body 202 made of such as a semiconductor, dielectric, ceramic or metal material. The second carrier 20b can be a wafer-level or panel-level substrate according to practical needs.

The second carrier 20b further has a bonding layer 203 made of such as a release film or an adhesive material. The bonding layer 203 is formed on the body 202 of the second carrier 20b by coating or laminating, and then laminated on the second surface 23b of the encapsulant 23. As such, the redistribution layer 25 is embedded in the bonding layer 203.

Further, the active surfaces 21a of the electronic elements 21 and the exposed surface of the circuit layer 22 are flush with the first surface 23a of the encapsulant 23.

Figure 2F:
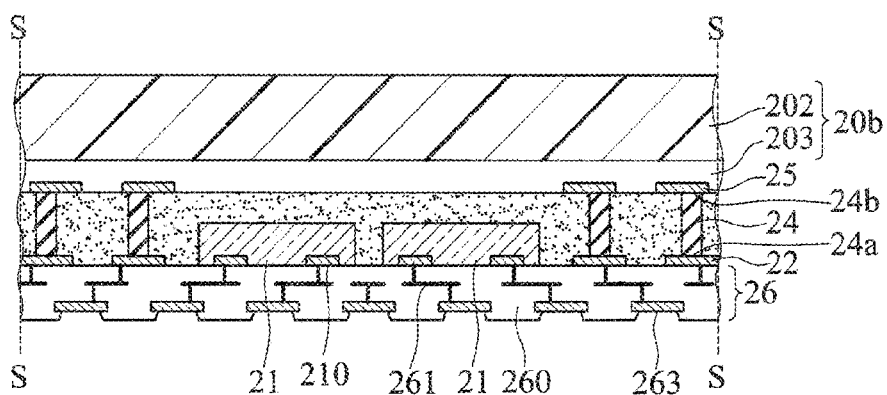
Figure 2G:
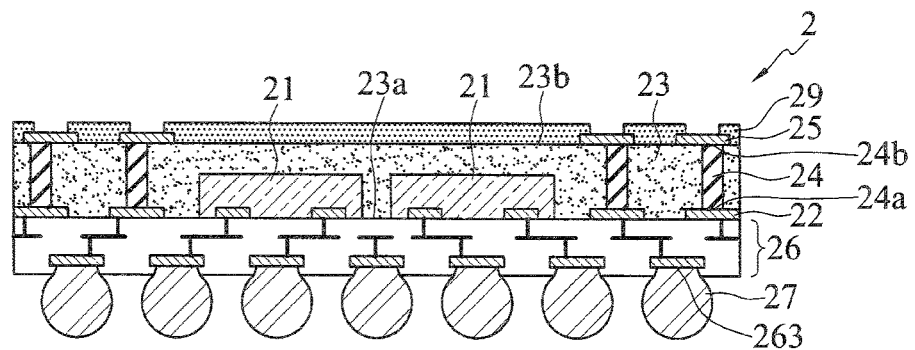
Figure 2G:
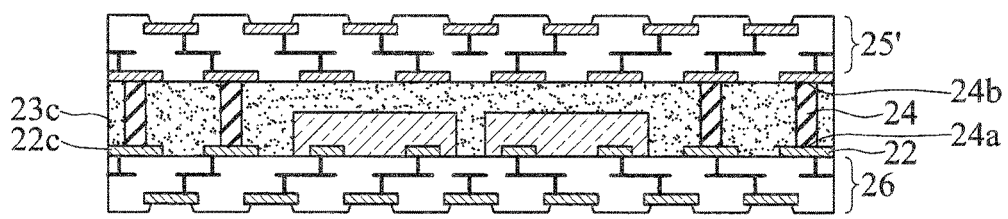

Referring to FIG. 2F, a redistribution layer (RDL) process is performed to form a circuit structure 26 on the first surface 23a of the encapsulant 23. The circuit structure 26 is electrically connected to the electrode pads 210 of the electronic elements 21 and the circuit layer 22.

In the present embodiment, the circuit structure 26 has a plurality of dielectric layers 260 and a plurality of circuits 261, 263.

Referring to FIG. 2G, the second carrier 20b is removed to expose the redistribution layer 25. Then, an insulating layer 29 such as a solder mask is formed on the second surface 23b of the encapsulant 23, and a portion of the redistribution layer 25 is exposed from the insulating layer 29 to serve as external connection pads. Thereafter, a singulation process is performed along a cutting path S as shown in FIG. 2F, and a plurality of conductive elements 27 such as solder balls are formed on and electrically connected to the outermost circuits 263 of the circuit structure 26. As such, a package structure 2 is obtained. Further, an electronic device (not shown), for example, a circuit board, can be disposed on the conductive elements 27.

Referring to FIG. 2H, an electronic device 28 is stacked on the second surface 23b of the encapsulant 23 and electrically connected to the redistribution layer 25, thus forming a stack-type package structure 2'.

The electronic device 28 can be, but not limited to, a package, a chip or a substrate. In the present embodiment, the electronic device 28 has a wire-bonding chip 281. In other embodiments, the electronic device 28 can have a flip chip.

Further, the electronic device 28 is electrically connected to the redistribution layer 25 through a plurality of conductive elements 280 such as solder bumps or copper bumps.

In another embodiment, referring to FIG. 2H', a non-tracing area is defined on the second surface 23b of the encapsulant 23 over the inactive surfaces 21b' of the electronic elements 21, and a plurality of openings 230 are formed in the non-tracing area in the process shown in FIG. 2C. As such, after the second carrier 20b is removed, the inactive surfaces 21b' of the electronic elements 21 are exposed from the second surface 23b of the encapsulant 23 for mounting heat dissipation elements or external connection elements. For example, the conductive elements 280 can be disposed on the inactive surfaces 21b' of the electronic elements 21.

In a further embodiment, referring to FIG. 2H", the inactive surfaces 21b" of the electronic elements 21 are flush with the second surface 23b of the encapsulant 23.

According to the present disclosure, the circuit layer 22 and the conductive posts 24 are formed first, and then the encapsulant 23 is formed to encapsulate the conductive posts 24 and the circuit layer 22. As such, the present disclosure dispenses with conventional processes such as a laser drilling process for forming through holes, a cleaning process for cleaning the through holes, and an electroplating process for forming conductive posts in the through holes. Therefore, the present disclosure not only reduces the fabrication time, but also avoids delamination of the conductive posts caused by uneven wall surfaces of the through holes in the prior art, so as to increase the reliability of the package structure 2.

Further, the present disclosure does not need any drilling alignment process, and hence dispenses with the special processes and devices used in the prior art, thereby simplifying the fabrication process and reducing the fabrication costs.

Furthermore, since no laser drilling process is performed, no heat affected zone is produced in the present disclosure. Therefore, the position of the conductive posts 24 can be designed according to practical needs, and the distance between the conductive posts 24 and the electronic elements 21 can be reduced. As such, the size of the package structure 2 can be reduced to meet the miniaturization requirement.

In addition, by dispensing with the hole opening process, the present disclosure only needs two carrier bonding/removing processes (including the first carrier 20a and the second carrier 20b), thus simplifying the fabrication process and reducing the fabrication costs.

The present disclosure further provides a package structure 2, 2', which has: an encapsulant 23 having opposite first and second surfaces 23a, 23b; a circuit layer 22 embedded in the first surface 23a of the encapsulant 23; at least an electronic element 21 embedded in the encapsulant 23; and a plurality of conductive posts 24 formed on the circuit layer 22 and embedded in the encapsulant 23, wherein each of the conductive posts 24 has a first end 24a bonded to the circuit layer 22 and a second end 24b opposite to the first end 24a.

In an embodiment, a surface (for example, an active surface 21a) of the electronic element 21 is flush with the first surface 23a of the encapsulant 23.

In an embodiment, the package structure 2, 2' further has at least a redistribution layer 25, 25' formed on the second surface 23b of the encapsulant 23 and electrically connected to the second ends 24b of the conductive posts 24.

In an embodiment, a surface of the circuit layer 22 is flush with the first surface 23a of the encapsulant 23.

In an embodiment, a surface (for example, an inactive surface 21b', 21b") of the electronic element 21 is exposed from the second surface 23b of the encapsulant 23.

In an embodiment, the package structure 2, 2' further has a circuit structure 26 formed on the first surface 23a of the encapsulant 23 and electrically connected to the electronic element 21 and the circuit layer 22.

In an embodiment, the package structure 2' further has at least an electronic device 28 stacked on the second surface 23b of the encapsulant 23 and electrically connected to the second ends 24b of the conductive posts 24 through the redistribution layer 25, 25'.

Therefore, by forming the circuit layer and the conductive posts first followed by forming the encapsulant, the present disclosure dispenses with the hole opening process so as to simplify the fabrication process, reduce the fabrication time and costs, increase the product reliability, and reduce the size of the package structure.

Further, by dispensing with the hole opening process, the present disclosure reduces the number of carrier bonding/removing processes so as to simplify the fabrication process and reduce the fabrication costs.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of the present disclosure defined by the appended claims.

What is claimed is:

1. A method for fabricating a package structure, comprising:
   providing a first carrier having a circuit layer thereon;
   forming a plurality of conductive posts on the circuit layer and disposing at least an electronic element on the first carrier, wherein each of the conductive posts has a first end bonded to the circuit layer and a second end opposite to the first end;
   forming an encapsulant on the first carrier to encapsulate the conductive posts, the circuit layer and the electronic element, wherein the encapsulant has a first surface bonded to the first carrier and a second surface opposite to the first surface;
   disposing a second carrier on the second surface of the encapsulant;
   after disposing the second carrier on the second surface of the encapsulant, removing the first carrier;
   after disposing the second carrier and removing the first carrier, forming a circuit structure on the first surface of the encapsulant, wherein the circuit structure is electrically connected to the electronic element and the circuit layer; and
   removing the second carrier.

2. The method of claim 1, wherein a surface of the circuit layer is flush with the first surface of the encapsulant.

3. The method of claim 1, wherein a surface of the electronic element is flush with the first surface of the encapsulant.

4. The method of claim 1, wherein the electronic element is exposed from the second surface of the encapsulant.

5. The method of claim 1, further comprising forming at least a redistribution layer on the second surface of the encapsulant, wherein the redistribution layer is electrically connected to the second ends of the conductive posts.

6. The method of claim 1, further comprising stacking at least an electronic device on the second surface of the encapsulant, wherein the electronic device is electrically connected to the second ends of the conductive posts.

* * * * *